(12) United States Patent
Kloffenstein et al.

(10) Patent No.: US 6,323,168 B1
(45) Date of Patent: *Nov. 27, 2001

(54) POST PLASMA ASHING WAFER CLEANING FORMULATION

(75) Inventors: Thomas J. Kloffenstein, Union City; Daniel N. Fine, Fremont, both of CA (US)

(73) Assignee: Advanced Technology Materials, Inc., Danbury, CT (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/675,500

(22) Filed: Jul. 3, 1996

(51) Int. Cl.$^7$ ........................................ C11D 3/20
(52) U.S. Cl. .................. 510/175; 510/405; 510/505; 134/1.2; 134/1.3
(58) Field of Search ............... 134/1.2, 1.3; 510/175, 510/405, 505

(56) References Cited

U.S. PATENT DOCUMENTS

| | | | |
|---|---|---|---|
| 3,900,522 | * | 8/1975 | Greco . |
| 4,395,348 | * | 7/1983 | Lee ........................ 252/143 |
| 4,774,229 | * | 9/1988 | Jordan . |
| 4,938,839 | * | 7/1990 | Fujimura et al. .............. 156/628 |
| 5,498,293 | * | 3/1996 | Hardi et al. ................. 134/3 |
| 5,597,420 | * | 1/1997 | Ward ........................ 134/38 |
| 5,648,324 | * | 7/1997 | Honda et al. ................ 510/176 |
| 5,665,688 | * | 9/1997 | Honda et al. ................ 510/178 |

OTHER PUBLICATIONS

Kern, "Overview and evolution of semiconductor wafer contamination and cleaning technology", pp. 3–67 in Kern, ed., Hndbook of Semiconductor Wafer Cleaning Technology, Noyes Publications, Westwood, New Jersey, 1993.*

Handbook of Chemistry and Physics, fortieth edition, edited by Hodgman et al., 1958.*

Industrial Solvents Handbook, ed by Flick, definition of bubyrolactone, 1998.*

Handbook of Chemistry and Physics, p 1198, 1199 40th ed., 1958.*

* cited by examiner

*Primary Examiner*—Margaret Einsmann
(74) *Attorney, Agent, or Firm*—Robert A. McLauchlan, III

(57) ABSTRACT

A semiconductor wafer cleaning formulation for use in post plasma ashing semiconductor fabrication comprising the following components in the percentage by weight ranges shown:

| | |
|---|---|
| chelating agent | 1–15% |
| water | 25–99% |
| polar organic solvent | 0–60% |

In the preferred embodiment the chelating agent is catechol (1,2-dihydroxybenzene) and the polar organic solvent is gamma butyrolactone (BLO).

5 Claims, No Drawings

POST PLASMA ASHING WAFER CLEANING FORMULATION

BACKGROUND OF THE INVENTION

1. Field of the Invention

The present invention relates generally to chemical formulations used in semiconductor wafer fabrication and particularly to chemical formulations that are utilized to remove residue from wafers following a resist plasma ashing step.

2. Description of the Prior Art

The prior art teaches the utilization of various chemical formulations to remove residue and clean wafers following a resist ashing step. Generally, these prior art chemical formulations include strong reagents such as strong acids, strong bases and/or highly reactive amine containing compounds. Such strong reagents can cause unwanted further removal of metal or insulator layers remaining on the wafer and are therefore undesirable in many instances. A particular problem with strippers containing both amine component(s) and water is corrosion of metal, particularly aluminum and aluminum-copper alloys. There is therefore a need for chemical formulations which effectively remove residue following a resist ashing step which do not attack and potentially degrade delicate structures which are meant to remain on a wafer.

SUMMARY OF THE INVENTION

A semiconductor wafer cleaning formulation for use in post plasma ashing semiconductor fabrication comprising the following components in the percentage by weight ranges shown:

| | |
|---|---|
| chelating agent | 1–15% |
| water | 25–99% |
| polar organic solvent | 0–60% |

In the preferred embodiment the chelating agent is catechol (1,2-dihydroxybenzene) and the polar organic solvent is gamma butyrolactone (BLO).

It is an advantage of the present invention that it effectively removes inorganic residues following a plasma ashing step.

It is another advantage of the present invention that it effectively removes metal halide and metal oxide residues following plasma ashing.

It is a further advantage of the present invention that it effectively removes inorganic residue from a semiconductor wafer following plasma ashing without containing a strong acid, strong base and/or amine containing compound.

These and other features and advantages of the present invention will become understood to those of ordinary skill in the art upon review of the following detailed description of the preferred embodiments.

DETAILED DESCRIPTION OF THE PREFERRED EMBODIMENTS

Typical steps in the fabrication of semiconductor wafers involve the creation of a metalized layer having a patterned resist layer formed thereon. Such a wafer may then be exposed to a metal etching plasma (such as a halogen based plasma) to remove exposed metal. Thereafter, a plasma ashing step is conducted (typically using an oxygen based plasma) in which the remaining resist is removed from the wafer. The result is a patterned metalized layer.

This series of steps generally results in a residue which must be removed from the wafer prior to further fabrication steps. The residue following the plasma ashing step is predominantly composed of inorganic compounds such as metal halides and metal oxides.

Various chemical formulations are currently used to remove the inorganic compound residues. These formulations are generally holdovers from older semiconductor fabrication wet chemical resist removal processes that were used prior to the introduction of the resist plasma ashing technology. The prior formulations thus typically contain strong acids or strong bases or highly reactive amine compounds to remove residues that remained following the wet chemical resist removal step.

The present invention comprises chemical formulations for the removal of inorganic compound residues, where the formulations do not contain strong acids, strong bases and/or reactive amine compounds of the prior art formulations. The general formulation of the present invention has two or three components that are present in the following ranges (where the percent (%) given is percent by weight):

| | |
|---|---|
| Organic Chelating Agent | 1–15% |
| Water | 25–99% |
| Polar Organic Solvent | 0–60% |

A preferred general formulation is created where the organic chelating agent is Catechol (1,2-dihydroxybenzene) and the polar organic solvent is Gamma butyrolactone (BLO). Thus, a preferred general formulation is:

| | |
|---|---|
| Catechol | 1–15% |
| Water | 25–99% |
| BLO | 0–60% |

As is seen from the above formulation ranges, a first included series of formulations exists where there is zero BLO (BLO 0%). That is, a formulation of Catechol 1–10% and water 90–99% Within these parameters a preferred formulation comprises:

| | |
|---|---|
| Catechol | 7–10% |
| Water | 90–93% |

Regarding the three component formulations described above, a preferred three component formulation within the range of parameters is:

| | |
|---|---|
| Catechol | 7–12% |
| Water | 40–83% |
| BLO | 10–40% |

Both preferred formulations have been shown to be effective in removing inorganic compound residues following plasma ashing of the resist. The following examples describe the utilization of the preferred formulations.

EXAMPLE I

A first example of the present invention involved wafers having 3-layer metal lines containing a top layer of titanium nitride (1200 Å thick), a middle layer of aluminum (99.5%) copper (0.5%) alloy (1000 Å thick), and a bottom layer of Titanium/Tungsten alloy (1500 Å thick). The substrate was silicon oxide and the width of metal lines was approximately 0.8 microns.

The wafers were metal-etched with a chlorine-containing plasma which was followed by an oxygen plasma ashing of the resist. This was followed by immersion of the wafers in a bath of the present invention containing catechol 10%, water 50% and BLO 40% at 60° C. for 30 minutes followed by washing with deionized water. Further testing has demonstrated that effective residue removal is obtained in a temperature range of 450° to 75° C., and with wafer exposure times in a range of 15 to 60 minutes. Additionally, rather than utilizing wafer immersion techniques, the solutions could be sprayed onto the wafers using automated spray tools followed by a water rinse.

EXAMPLE II

A second set of wafers which were identical to the set utilized in Example I, were processed utilizing a different cleaning formulation. Specifically, the wafers were metal-etched with a chlorine-containing plasma which was followed by an oxygen plasma ashing of the resist. This was followed by immersion of the wafers in a bath of the present invention containing catechol 8% and water 92%, at 60° C. for 30 minutes followed by washing with deionized water. As with the prior example, a formulation temperature of 45 to 75° C. with a wafer exposure time of 15 to 60 minutes will produce satisfactory results.

Regarding both examples above, inspection of SEM photomicrographs of processed wafers was utilized to evaluate the stripping effectiveness of the formulations and also to confirm lack of corrosivity to metal features.

To someone of ordinary skill in the art it would be expected that chelating agents related to catechol and other polar organic solvents may also be utilized with comparable results. Catechol-related chelating agents would include derivatives of benzene, naphthalene, and aromatic heterocyclic compounds having at least two hydroxyl (OH) groups on adjacent carbon atoms. Other polar organic solvents which could be utilized include N-Methylpyyrolidinone (NMP); Sulfolane; Propylene glycol monomethylether acetate (PMA); Ethylene glycol and propylene glycol; and Dimethylsulfoxide.

While the present invention has been shown and described with reference to particular preferred embodiments, it is to be understood that other and further changes and modifications of the invention will become apparent to those skilled in the art after understanding the present invention. It is therefore intended that the following claims cover all such alterations and modifications as fall within the true spirit and scope of the invention.

What is claimed is:

1. A semiconductor wafer cleaning formulation for use in the post plasma ashing semiconductor fabrication consisting essential 14 of the following components in the percent by weight ranges shown:

| | |
|---|---|
| catechol (1,2-dihydroxybenzene) | 7–12% |
| water | 48–83% |
| gamma butylrolactone (BLO). | 10–40%. |

2. A cleaning formulation as described in claim 1 wherein the quality of catechol is in the range of 7–10%.

3. A semiconductor wafer cleaning formulation for use in post plasma ashing semiconductor fabrication comprising the following components in the percentage by weight ranges shown:

| | |
|---|---|
| catechol (1,2-dihydroxybenzene) | 1–15% |
| water | 25–89% |
| gamma butyrolactone (BLO) | 10–60% | wherein said formulation contains no strong acids, no amines and no strong bases.

4. A cleaning formulation as described in claim 3 wherein the quantity of catechol is in the range of 7–10%.

5. A cleaning formulation as described in claim 3 wherein the quantity of catechol is in the range 7–12%, the quantity of water is in the range of 48–83% and the quantity of BLO is in the range of 10–40%.

\* \* \* \* \*